(12) United States Patent
Zhou

(10) Patent No.: US 7,196,552 B2
(45) Date of Patent: Mar. 27, 2007

(54) COMPARATOR CIRCUIT WITH OFFSET CANCELLATION

(75) Inventor: Dacheng Zhou, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 11/103,954

(22) Filed: Apr. 12, 2005

(65) Prior Publication Data

US 2006/0226878 A1    Oct. 12, 2006

(51) Int. Cl.
*H03K 5/22* (2006.01)
(52) U.S. Cl. .......................... 327/65; 327/307; 327/57
(58) Field of Classification Search ................ 327/55, 327/57, 65, 307, 563
See application file for complete search history.

(56) References Cited

U.S. PATENT DOCUMENTS

| | | | |
|---|---|---|---|
| 6,320,426 B1 * | 11/2001 | Shih | 327/65 |
| 6,597,225 B1 * | 7/2003 | Gabara | 327/211 |
| 2003/0058046 A1 * | 3/2003 | Moon | 330/250 |
| 2006/0132191 A1 * | 6/2006 | Palmer | 327/52 |

* cited by examiner

*Primary Examiner*—Long Nguyen

(57) ABSTRACT

A method of comparing signals includes obtaining first and second signals to be compared and first and second offset cancellation signals, combining the first offset cancellation signal with the first signal to be compared to form a first combined signal and combining the second offset cancellation signal with the second signal to be compared to form a second combined signal, comparing the combined first signal with the combined second signal, and producing an output indicating which of the combined first signal or the combined second signal is greater.

18 Claims, 8 Drawing Sheets

COMPARATOR CIRCUIT WITH OFFSET CANCELLATION

BACKGROUND

A comparator circuit may be used in an electronic system to compare two input currents or voltages and output an indication of which is greater. A typical comparator circuit is fabricated in an integrated circuit using field effect transistors or CMOS transistors. The output should ideally change state when the two changing inputs cross over at an equal level. However, variations in the transistors, such as the size or electrical properties, can unbalance the comparator circuit. For example, process variations during fabrication of the transistors can unbalance the transistors. As a result, the comparator circuit may be biased toward one of the inputs, so that the output changes state when one input is larger than the other rather than when the inputs are equal.

SUMMARY

An exemplary embodiment may comprise a method for comparing signals, including obtaining first and second signals to be compared and first and second offset cancellation signals, combining the first offset cancellation signal with the first signal to be compared to form a first combined signal and combining the second offset cancellation signal with the second signal to be compared to form a second combined signal. The method also includes comparing the combined first signal with the combined second signal and producing an output indicating which of the combined first signal or the combined second signal is greater.

BRIEF DESCRIPTION OF THE DRAWINGS

Illustrative embodiments are shown in the accompanying drawings as described below.

DESCRIPTION

The drawings and description, in general, disclose a comparator circuit with offset cancellation. Any offsets or bias in the comparator circuit introduced during fabrication, such as those due to process variations, may be cancelled using a pair of offset cancellation inputs. As will be described below, the comparator circuit with offset cancellation provides high input sensitivity, low coupling noise, a fast resolving time, and a full output swing.

Figure 1:
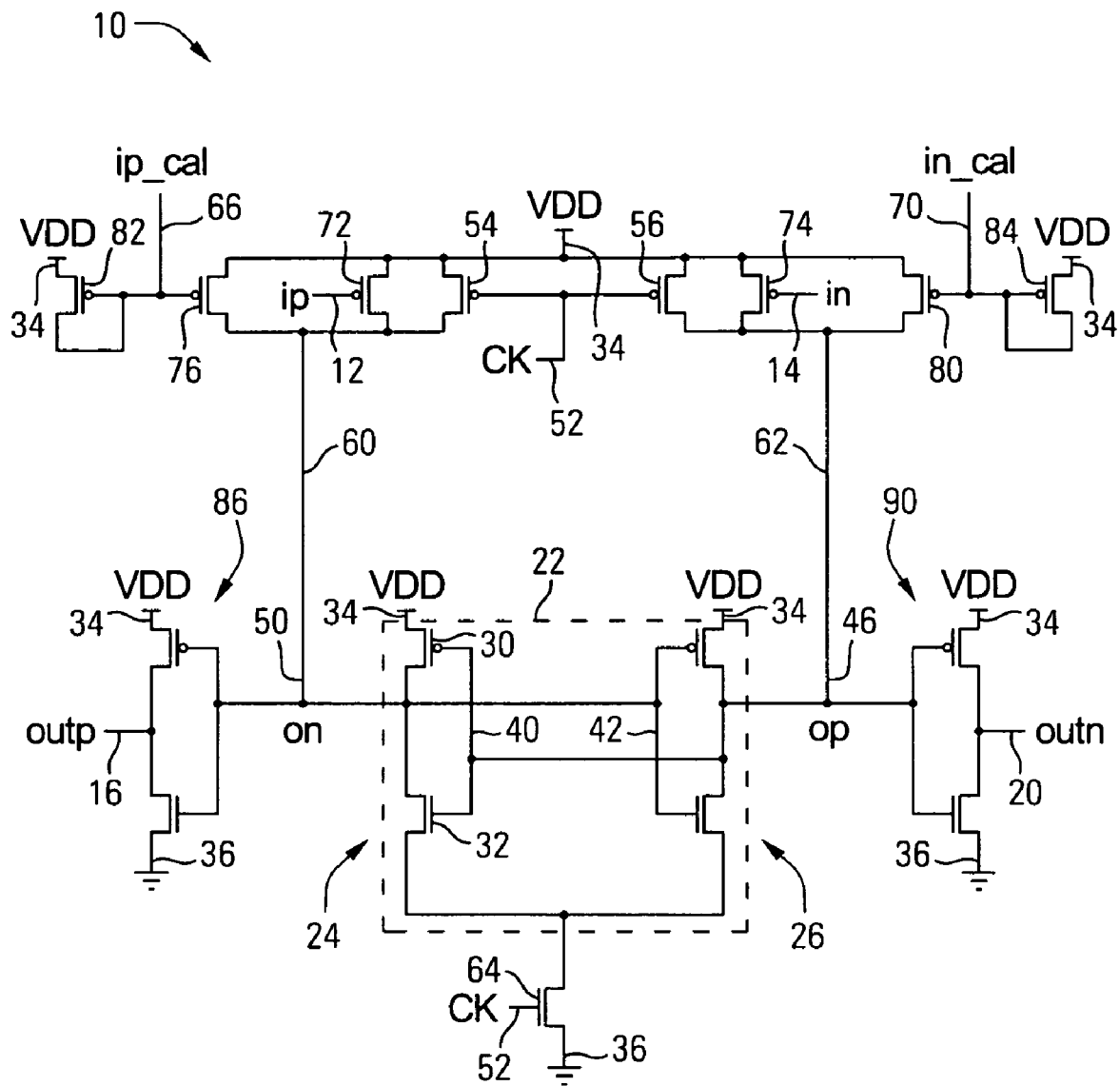
FIG. 1 is a schematic diagram of an exemplary comparator circuit with offset cancellation.

Referring now to FIG. 1, an exemplary embodiment 10 of the comparator circuit with offset cancellation will be described in more detail. The comparator circuit 10 compares the values of two inputs, ip 12 and in 14, and produces two outputs, outp 16 and outn 20. When ip 12 is greater than in 14, the outp 16 output will be asserted (high) and the outn 20 output will be unasserted (low). When in 14 is greater than ip 12, the outn 20 output will be asserted (high) and the outp 16 output will be unasserted (low).

Although the exemplary comparator circuit 10 is implemented as an integrated circuit using p-channel field effect transistors (PFETS) and n-channel field effect transistors (NFETS), it may be alternatively implemented using any suitable technique, such as in software. The comparator circuit 10 as claimed herein should therefore not be viewed as limited to the exemplary embodiment described herein.

The exemplary comparator circuit 10 includes a pair of cross-coupled inverters 22 to perform the actual comparison. Each 24 and 26 of the cross-coupled inverters 22 includes a PFET (e.g., 30) and an NFET (e.g., 32) connected in series between power 34 and ground 36. The inputs 40 and 42 of each of the cross-coupled inverters 22 are connected to the outputs op 46 and on 50 of the other of the cross-coupled inverters 22, respectively. (The outputs op 46 and on 50 of the cross-coupled inverters 22 will be referred to hereafter as intermediate outputs to differentiate these output nodes with the ultimate output nodes outp 16 and outn 20 of the comparator circuit 10.)

The intermediate outputs op 46 and on 50 are precharged to the voltage level of a supply voltage VDD 34 during low phases of a clock signal CK 52. Precharging PFETS 54 and 56 are connected between VDD 34 and intermediate output nodes on 50 and op 46, respectively. (Note that because the exemplary comparator circuit 10 includes the pair of cross-coupled inverters 22, intermediate output nodes op 46 and on 50 are connected to nodes 60 and 62 associated with the ip 12 and in 14 input signals, respectively.) The gates of the precharging PFETS 54 and 56 are connected to the clock signal CK 52. Thus, when the clock signal CK 52 is low, the intermediate output nodes op 46 and on 50 are connected to VDD 34 and are precharged to a high level. The pair of cross-coupled inverters 22 are connected to ground 36 through a clocked NFET 64 to differentiate the evaluation phase of the comparator circuit 10 from the precharging phase. Thus, when the clock signal CK 52 is high, the pair of cross-coupled inverters 22 are connected to ground 36 and comparison is enabled.

The nodes 60 and 62 associated with the ip 12 and in 14 input signals are driven by a combination of the signals to be compared, ip 12 and in 14, and offset cancellation inputs ip_cal 66 and in_cal 70. The input signals to be compared, ip 12 and in 14, control PFETS 72 and 74, respectively. The input PFETS 72 and 74 are connected between VDD 34 and nodes 60 and 62 to the pair of cross-coupled inverters 22. The input signals to be compared, ip 12 and in 14, are connected to the gates of the input PFETS 72 and 74 so that the voltages of nodes 60 and 62 are proportional to the voltages of the input signals ip 12 and in 14. The offset cancellation signals ip_cal 66 and in_cal 70 also contribute to nodes 60 and 62. Offset cancellation PFETS 76 and 80 are connected between VDD 34 and nodes 60 and 62, with ip_cal 66 and in_cal 70 connected to their gates. The exemplary comparator circuit 10 uses static current inputs at ip_cal 66 and in_cal 70, so current mirror PFETS 82 and 84 are used to generate a bias voltage from the static input currents at ip_cal 66 and in_cal 70. (Alternatively, the comparator circuit may be adapted for use with static voltages at the offset cancellation inputs.) The source of each of the current mirror PFETS 82 and 84 is connected to VDD 34. The drain and gate of current mirror PFET 82 are connected to ip_cal 66, and the drain and gate of current mirror PFET 84 are connected to in_cal 70. Because the drains and gates of the current mirror PFETS 82 and 84 are connected, they operate as diodes, generating a bias voltage based on the offset cancellation current inputs ip_cal 66 and in_cal 70. Note that the input transistors 72, 74, 76, 80, 82 and 84 operate in analog mode, wherein the input voltage is converted to a proportional output current. The greater the gate bias voltage, the greater the output current will be.

Thus, ip 12 and ip_cal 66 are combined at node 60, and in 14 and in_cal 70 are combined at node 62. By providing static input currents of predetermined levels at ip_cal 66 and in_cal 70, any bias or offset in the comparator circuit 10 such as that due to process variation during fabrication can be compensated for and eliminated. The calibration process to identify the predetermined levels for ip_cal 66 and in_cal 70 will be described later.

Buffering inverters 86 and 90 are provided in the exemplary comparator circuit 10 to provide a full swing in the outputs outp 16 and outn 20.

The comparator circuit 10 provides high input sensitivity, low coupling noise and fast resolving time. Because bias or offset due to process variations can be compensated for, input PFETS 72 and 74 can be made smaller than in traditional comparator circuits. This increases input sensitivity, reduces resolving time, and reduces coupling noise. For example, in a traditional comparator circuit, the input PFET might have a width w of about 7 um. In the exemplary comparator circuit 10 with offset cancellation, input PFETS 72 and 74 have a width of about 3.2 um and a length of about 0.1 um, providing greater gain than the larger traditional input PFET and increasing input sensitivity. Coupling noise between intermediate output on 50 and input ip 12 and between intermediate output op 46 and input in 14 is also reduced by the relatively small size of the input PFETS 72 and 74. The relatively small input PFETS 72 and 74 also reduce the capacitive loading of intermediate outputs 46 and 50, resulting in faster switching time and higher input sensitivity.

Figure 2:
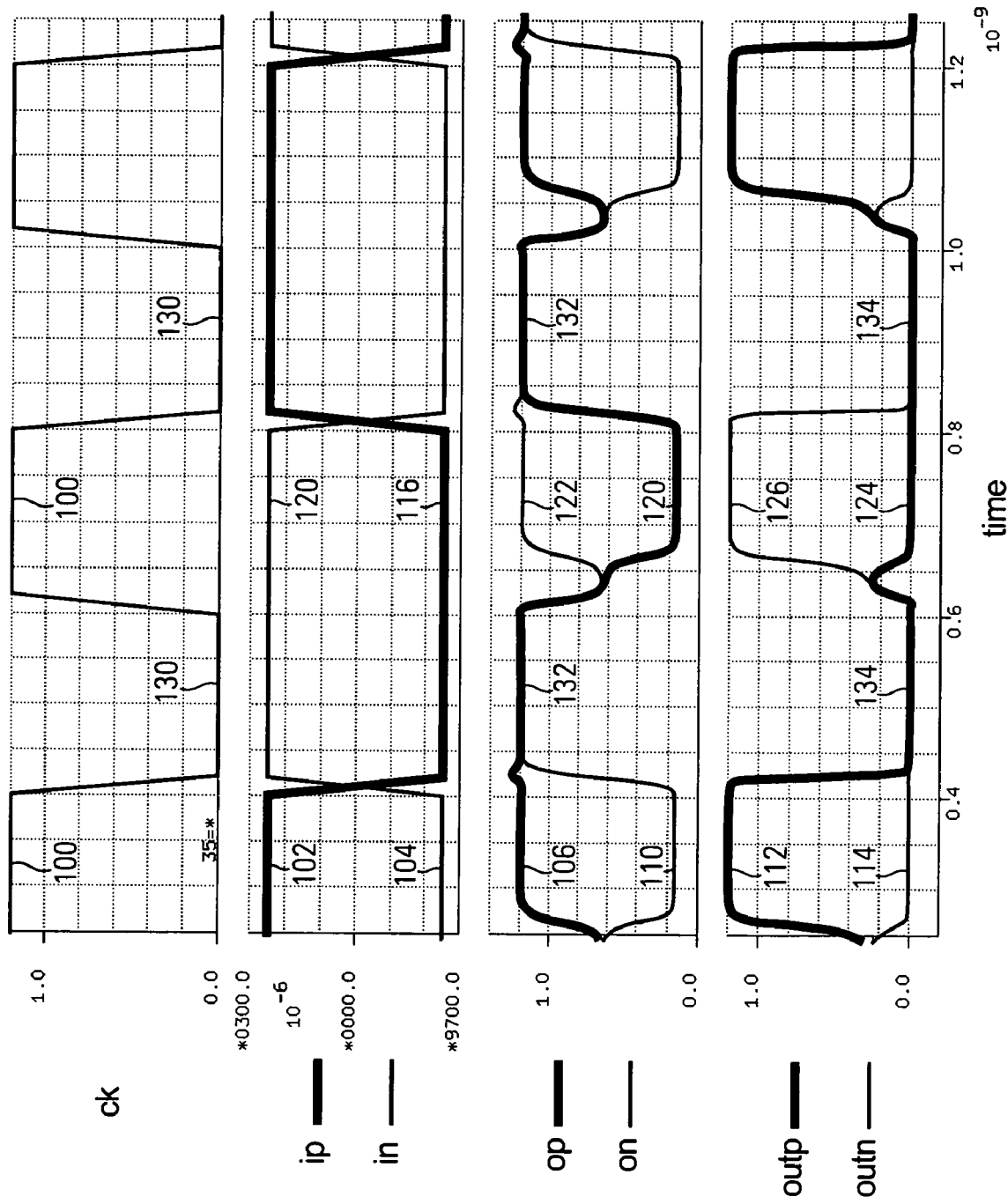
FIG. 2 is a timing diagram illustrating exemplary operation of the comparator circuit of FIG. 1.

Referring now to the timing diagram of FIG. 2, the operation of the exemplary comparator circuit 10 with offset cancellation will be described. The exemplary comparator circuit 10 operates at 1.08 volts, although this should not be viewed as limiting and may be adapted as desired. Thus, the illustrated traces for the clock signal CK 52, op 46, on 50, outp 16 and outn 20 range from 0 volts to about 1.1 volts. The ip 12 and in 14 input signals are plotted on a voltage scale of 349.7 mV to 350.3 mV, with the high voltage for each signal being at 350.2 mV, the low voltage at 349.8 mV, and a 0.4 mV swing.

When the clock signal CK 52 is high 100, the comparator circuit 10 is in the evaluation phase. If ip 12 is high 102 and in 14 is low 104, intermediate output node op 46 is high 106, intermediate output node on 50 is low 110, and output node outp 16 is high 112 and outn 20 is low 114. If ip 12 is low 116 and in 14 is high 120, intermediate output node op 46 is low 120 and on 50 is high 122, and output node outp 16 is low 124 and outn 20 is high 126. Note that as referred to in the claims below, either output outp 16 or outn 20 indicates which input signal is greater, although the states used to indicate which signal is greater may be different for the two outputs 16 and 20.

When the clock signal CK 52 is low 130, as described above, the exemplary comparator circuit 10 with offset cancellation is in the precharging phase. In this phase, regardless of the state of ip 12 and in 14, the intermediate output nodes op 46 and on 50 are driven high 132 by the precharging PFETS 54 and 56, so outputs outp 16 and outn 20 are low 134.

Figure 3:
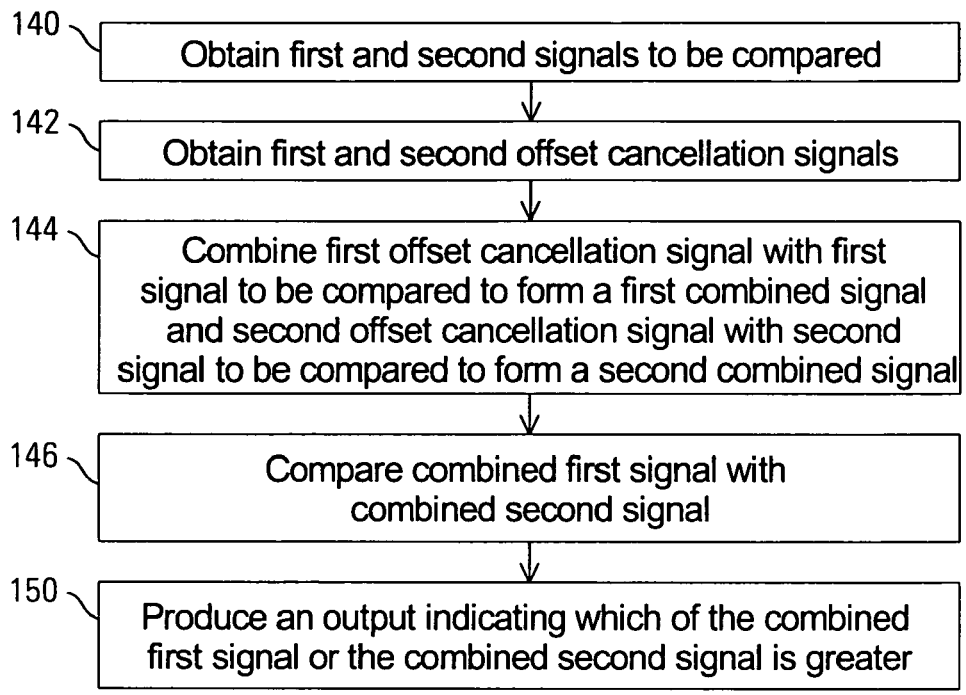
FIG. 3 is a flow chart illustrating an exemplary operation for comparing signals with offset cancellation.

An exemplary operation for comparing two values with offset cancellation is illustrated in the flowchart of FIG. 3. A pair of signals to be compared and a pair of offset cancellation signals are obtained 140 and 142. The first offset cancellation signal is combined 144 with the first signal to be compared to form a first combined signal. The second cancellation signal is similarly combined 144 with the second signal to be compared to form a second combined signal. The combined first signal and combined second signal are compared 146, and an output is produced 150 indicating which is greater.

An exemplary calibration process for the offset cancellation inputs ip_cal 66 and in_cal 70 will now be described. Note, however, that the calibration process may be performed differently as desired to find the correct offset cancellation levels. As described above, the offset cancellation inputs ip_cal 66 and in_cal 70 are provided with a static input current that determines the level of offset cancellation in the comparator circuit 10. The calibration process identifies the correct offset cancellation current levels for ip_cal 66 and in_cal 70 that balance the inputs as much as possible. The static currents may be provided in any manner desired. For example, the electronic circuit in which the comparator circuit 10 is placed may include a pair of static current sources whose current level is controlled by the values in a pair of registers.

Figure 4:
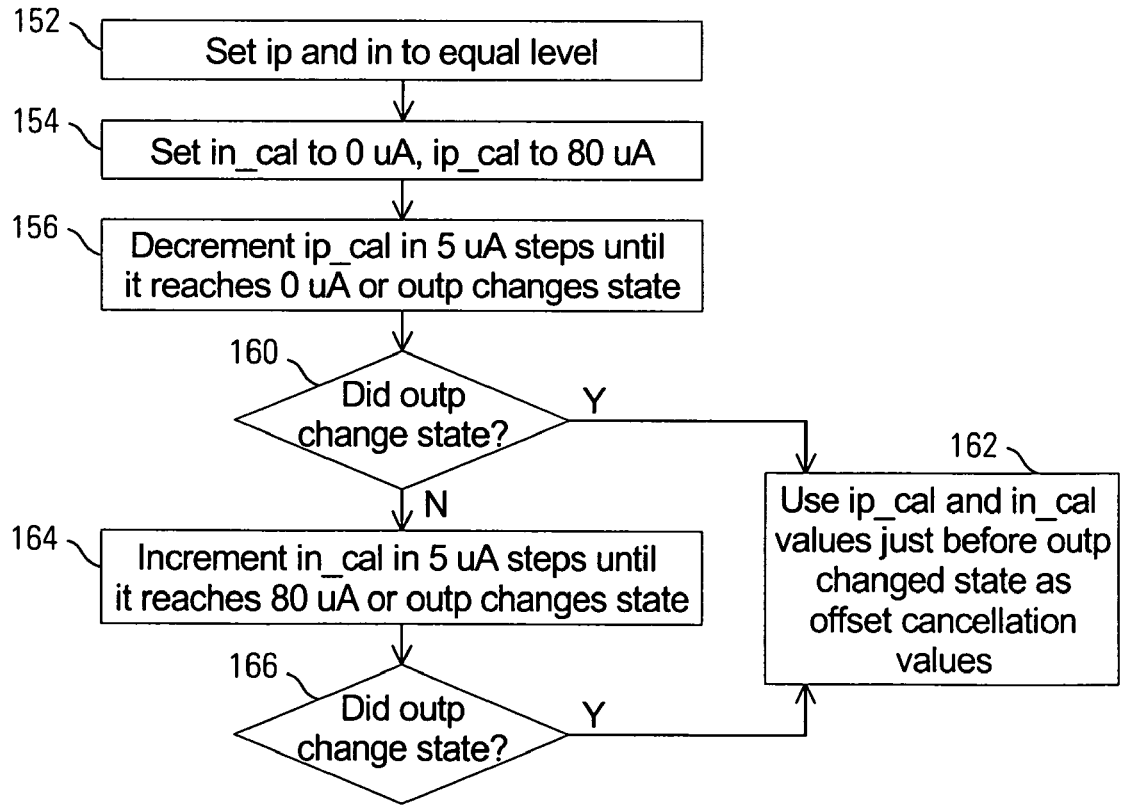
FIG. 4 is a flow chart illustrating an exemplary operation for calibrating the offset cancellation of the comparator circuit of FIG. 1.

The exemplary calibration process is summarized in the flowchart of FIG. 4. The ip 12 and in 14 inputs are set 152 to an equal level, such as 250 millivolts. If the comparator circuit 10 is balanced with no offset or bias, the output such as outp 16 will be on the edge of changing state when the inputs ip 12 and in 14 are set to an equal level. The in_cal 70 offset cancellation signal is set 154 to 0 uA and ip_cal 66 is set to 80 uA. The ip_cal 66 signal is decremented 156 in 5 uA steps until it reaches 0 uA or outp 16 changes state. (Note that a state change on the outn 20 output may alternatively be used to terminate the calibration process.) If 160 outp 16 changed state while ip_cal 66 was being decremented, the current settings for ip_cal 66 and in_cal 70 just before outp 16 changed state are used 162 as the static current levels during normal operation of the comparator circuit 10. Alternatively, the current settings for ip_cal 66 and in_cal 70 just after outp 16 changed state may be used. Note that the granularity of the changes to ip_cal 66 and in_cal 70 during the calibration process may affect the accuracy of the final settings. Because the current is changed in discrete steps, the exact current settings at which the comparator circuit 10 is balanced may not be discovered, although the comparator circuit will be substantially balanced. If more accuracy is desired, smaller current steps may be used.

If 160 outp 16 did not change state while ip_cal 66 was being decremented to a current level of zero, ip_cal 66 is left at zero current while in_cal 70 is incremented 164 in 5 uA steps until it reaches 80 uA or outp 16 changes state. If 166 outp 16 changed state, the current settings for ip_cal 66 and in_cal 70 just before outp 16 changed state are used 162 as the static current levels during normal operation of the comparator circuit 10. If outp 16 never changed state during the calibration process, the offset in the comparator circuit 10 may be too great to be cancelled.

As discussed above, the comparator circuit is not limited to the exemplary 5 uA steps. Similarly, the calibration process is not limited to the 80 uA current limits of the exemplary embodiment described herein. Each 5 uA step can cancel about 10 mV offset for certain fabrication process conditions. The offset cancellation ranges are therefore around −150 mV to +150 mV, although the correlation between current and voltage is not necessarily linear in the current mirrors 82 and 84.

Figure 5:
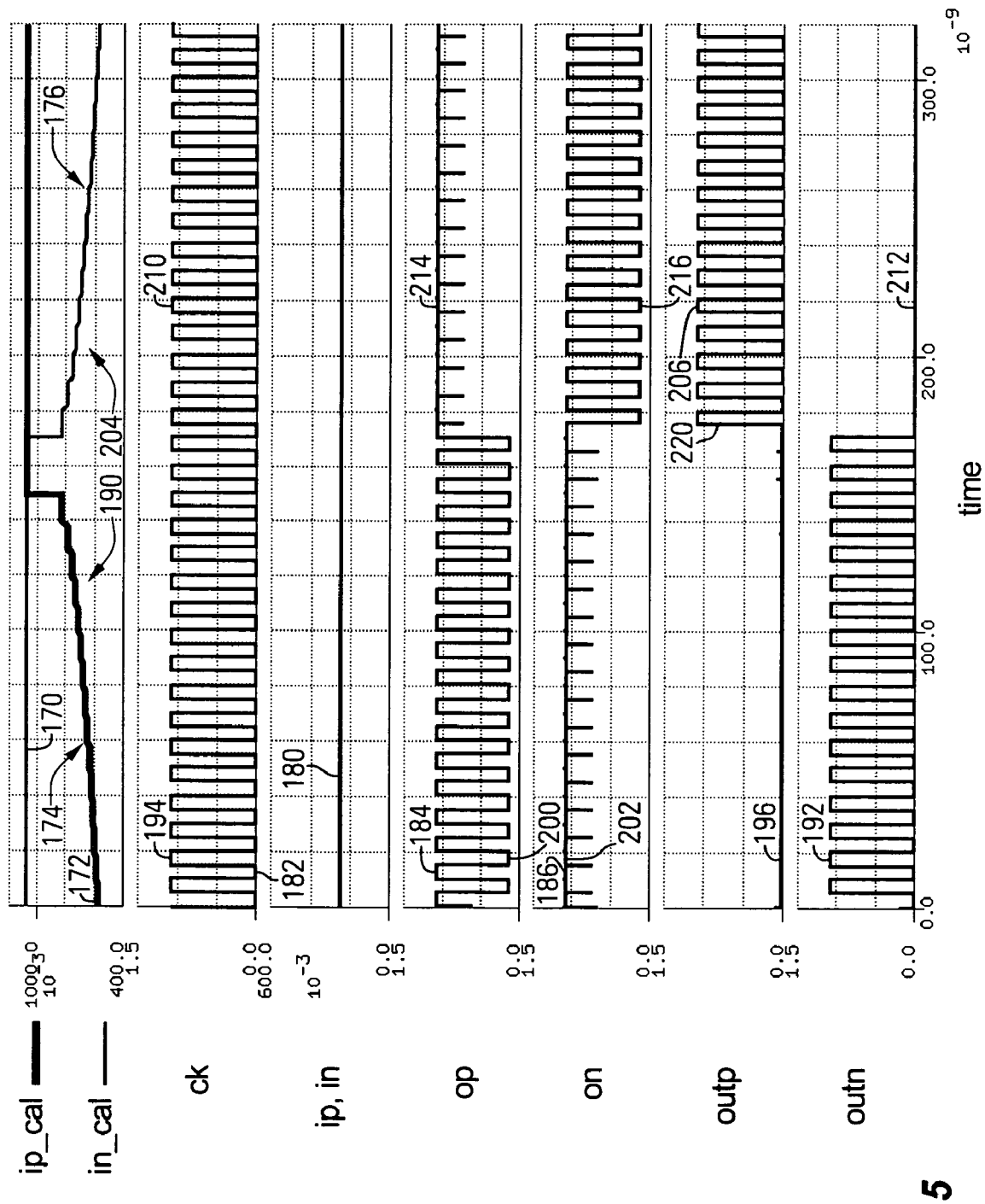
FIG. 5 is a timing diagram illustrating an exemplary calibration process for the comparator circuit of FIG. 1, with a balanced circuit.
Figure 6:
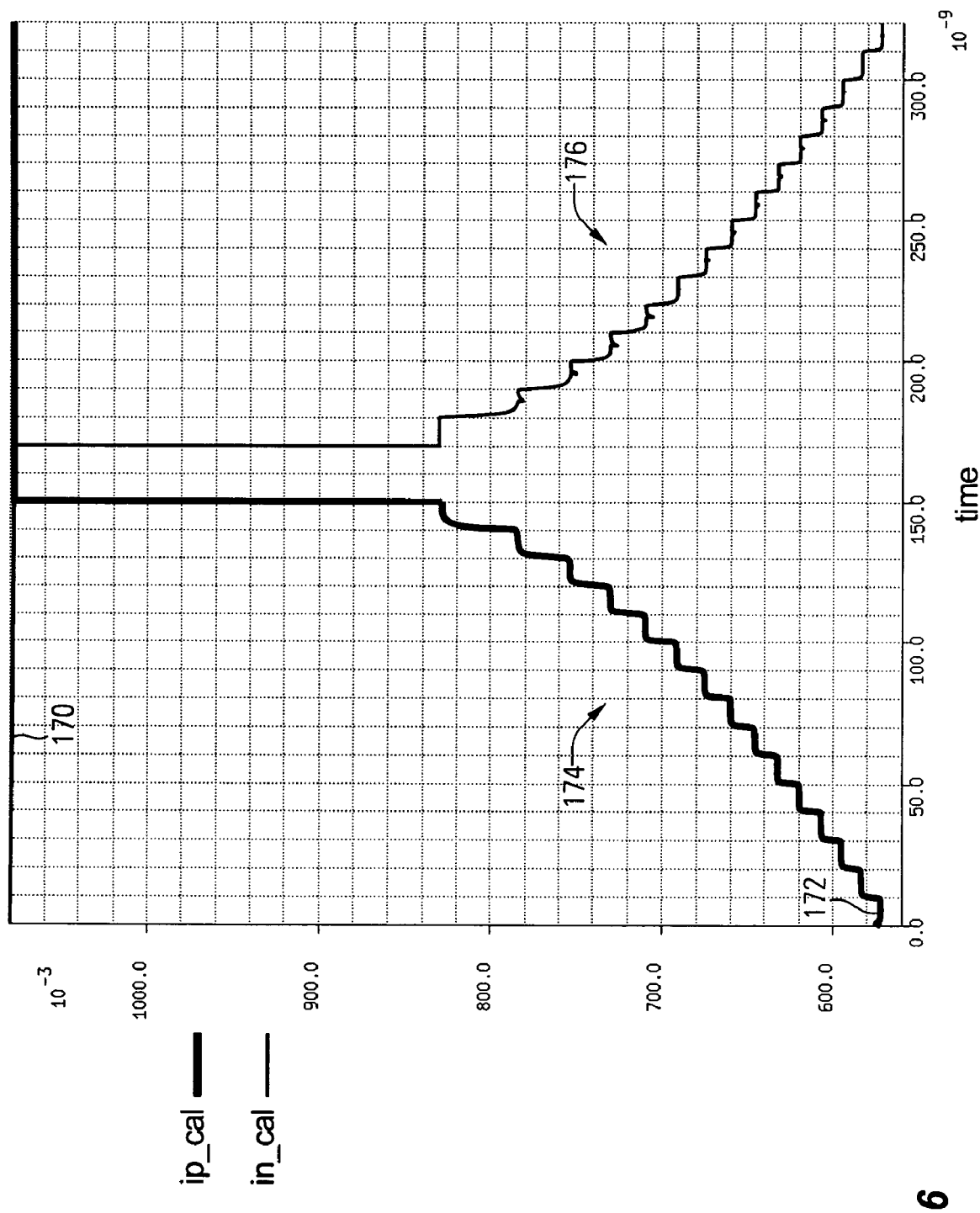
FIG. 6 is a timing diagram showing more detail of the offset cancellation signals during the calibration process of FIG. 5.

A timing diagram of an exemplary calibration process is illustrated in FIG. 5. In this timing diagram, the ip_cal 66 and in_cal 70 inputs are illustrated on a voltage scale from 400 millivolts to 1200 mV. As described earlier, the current mirrors 82 and 84 generate this bias voltage based on the static current input. Thus, when the input current to in_cal 70 is set to zero, a voltage 170 appears at in_cal 70 of about 1.08 volts, or VDD 34. The input current to ip_cal 66 is set to 80 uA, which creates a voltage 172 of about 580 mV. The input current to ip_cal 66 is decremented in steps 174 of 5 uA until it reaches a zero current level. The input current to in_cal 70 is then incremented in steps 176 of 5 uA until it reaches 80 uA. As described above, this calibration process may be halted as soon as the output changes state. Note that the stepped input currents of the calibration process are illustrated more clearly in the timing diagram of FIG. 6. Note that there is a voltage jump when the current changes from 0 uA to 5 uA due to the gate threshold voltage Vt of current mirror PFETS 76 and 80. In order to turn these PFETS on, the gate bias voltage must be greater than the gate threshold voltage. Note also that when there is no voltage offset on ip 12 and in 14 and ip_cal 66 and in_cal 70 are both set at 0 uA, the circuit is completely balanced and the cross-coupled inverter 22 will be in a metastable state. In theory, intermediate outputs op 46 and on 50 would stay at the same voltage level but be very unstable, and any small noise could flip the op 46 and on 50 to "0" or "1" randomly. In the exemplary timing diagrams, the comparator circuit behaves ideally and outp 16 does not change when there is no offset.

The remaining nodes of FIG. 5 are plotted on a voltage scale versus time, with the voltage scale for CK 52, op 46, on 50, outp 16 and outn 20 ranging from 0 v to 1.5 v, and the voltage scale for ip 12 and in 14 ranging from 0 v to 0.6 v.

The exemplary calibration process illustrated in the timing diagram of FIG. 5 applies to a comparator circuit with no offset. Furthermore, the full possible calibration process is illustrated, rather than ending the calibration process as soon as outp 16 changes state. During the calibration process, the clock signal CK 52 oscillates to alternate between the precharging phase and the evaluation phase. The ip 12 and in 14 inputs are set at an equal level 180 as described above, in this case 250 mV. Note that during each low cycle (e.g., 182) of the clock signal ck 52, both op 46 and on 50 are precharged to a high voltage level 184 and 186. During the first half 190 of the calibration process, in_cal 70 has a greater voltage level than ip_cal 66. The ip 12 and in 14 inputs are equal, as described above. Therefore, the combined input based on in 14 and in_cal 70 is greater than the combined input based on ip 12 and ip_cal 66. The expected output for a balanced comparator circuit during this first half 190 of the calibration process is therefore that outn 20 would be high 192 during the evaluation phase (e.g., 194), and outp 16 would be low 196. To achieve this result, the intermediate output op 46 is low 200 and on 50 is high 202. During the second half 204 of the calibration process, ip_cal 66 has a greater voltage level than in_cal 70. Therefore, the combined input based on ip 12 and ip_cal 66 is greater than the combined input based on in 14 and in_cal 70. The expected output for the balanced comparator circuit during this second half 204 of the calibration process is that outp 16 would be high 206 during the evaluation phase (e.g., 210), and outn 20 would be low 212. The intermediate output op 46 is high 214 and on 50 is low 216. Again, the comparator circuit calibrated in the timing diagram of FIG. 5 is balanced and has no offset, so outp 16 first changes state 220 when ip 12 is equal to in 14 and ip_cal 66 is equal to in_cal 70. If the comparator circuit is biased, the comparator circuit 10 will be pulled to one output state or the other by the bias when ip and in are set to an equal voltage level. The next two examples illustrate the calibration process for comparator circuits that are biased toward the in and ip inputs.

Figure 7:
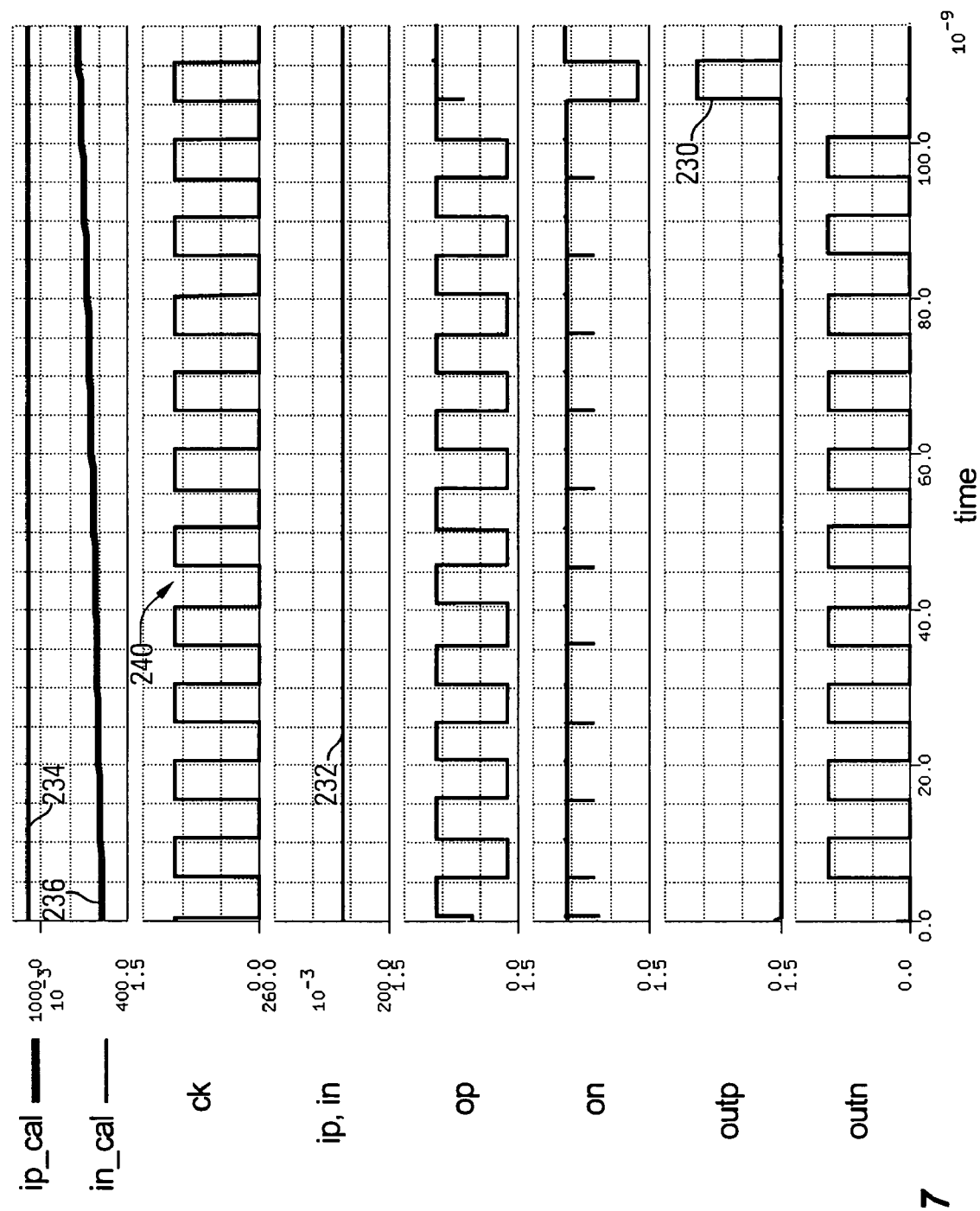
FIG. 7 is a timing diagram illustrating an exemplary calibration process for the comparator circuit of FIG. 1 with the circuit unbalanced in one exemplary way.

Referring now to FIG. 7, a calibration process for a comparator circuit with a 50 mV bias due to a stronger PFET 74 will be described. In this case, the timing diagram of FIG. 7 only covers the exemplary calibration process, which ends as soon as outp 16 changes state 230. Again, ip 12 and in 14 are set to the same voltage level 232 of 250 mV. The in_cal 70 signal is set to a current of 0 uA, from which current mirror 84 generates a voltage 234 of 1.08 volts. The ip_cal 66 signal is set to an initial current of 80 uA, from which current mirror 82 generates a voltage 236 of about 580 mV. The clock signal CK 52 oscillates 240, establishing the precharging phases and evaluation phases for the comparator circuit. The input current at ip_cal 66 is decremented in 5 uA steps as described above, one step per clock cycle, until in this case outp 16 changes state 230. Note that if outp 16 had not changed state, the calibration process would have continued by incrementing the current of in_cal 70. The current levels of ip_cal 66 and in_cal 70 just before outp 16 changed state 230, 30 uA and 0 uA, respectively, are used as the static current offset cancellation signals applied to ip_cal 66 and in_cal 70 during normal operation of the comparator circuit 10.

The bias value is counted herein from the center, wherein there is no offset, instead of from the beginning of the calibration because the calibration is started at a position of maximum positive offset. The exemplary calibration of FIG. 7 stops after taking 11 steps. Because there are 16 possible calibration steps during the stepping of ip_cal 66, the bias voltage is 10 mV*(16−11) mV=50 mV. If the calibration process crosses the middle at which both ip_cal 66 and in_cal 70 are at 0 uA, the bias voltage changes polarity and equals the step*10 mV, which is a negative bias. However, it is important to note that this terminology for the bias voltage should not be viewed as a limitation, and other terminologies may be used. Note also that the relationship between the offset cancellation bias current (ip_cal/in_cal) and bias voltage is not necessarily linear, and is dependent upon the operation region of the transistors.

Note also that the calibration process is not limited to one current step per clock cycle, as in the exemplary calibration process of FIG. 7. For example, in one exemplary embodiment the calibration process performs one current step per 64 clock cycles in order to average the output, thereby reducing the affect of noise on the calibration process.

The calibration process may be performed whenever desired, such as during a self test process of an overall electronic system in which the comparator circuit is placed, or only once after the comparator circuit is fabricated. As described above, the static current levels for ip_cal 66 and in_cal 70 may be stored in registers outside the comparator circuit to control current sources, or may be supplied in any other suitable manner.

Figure 8:
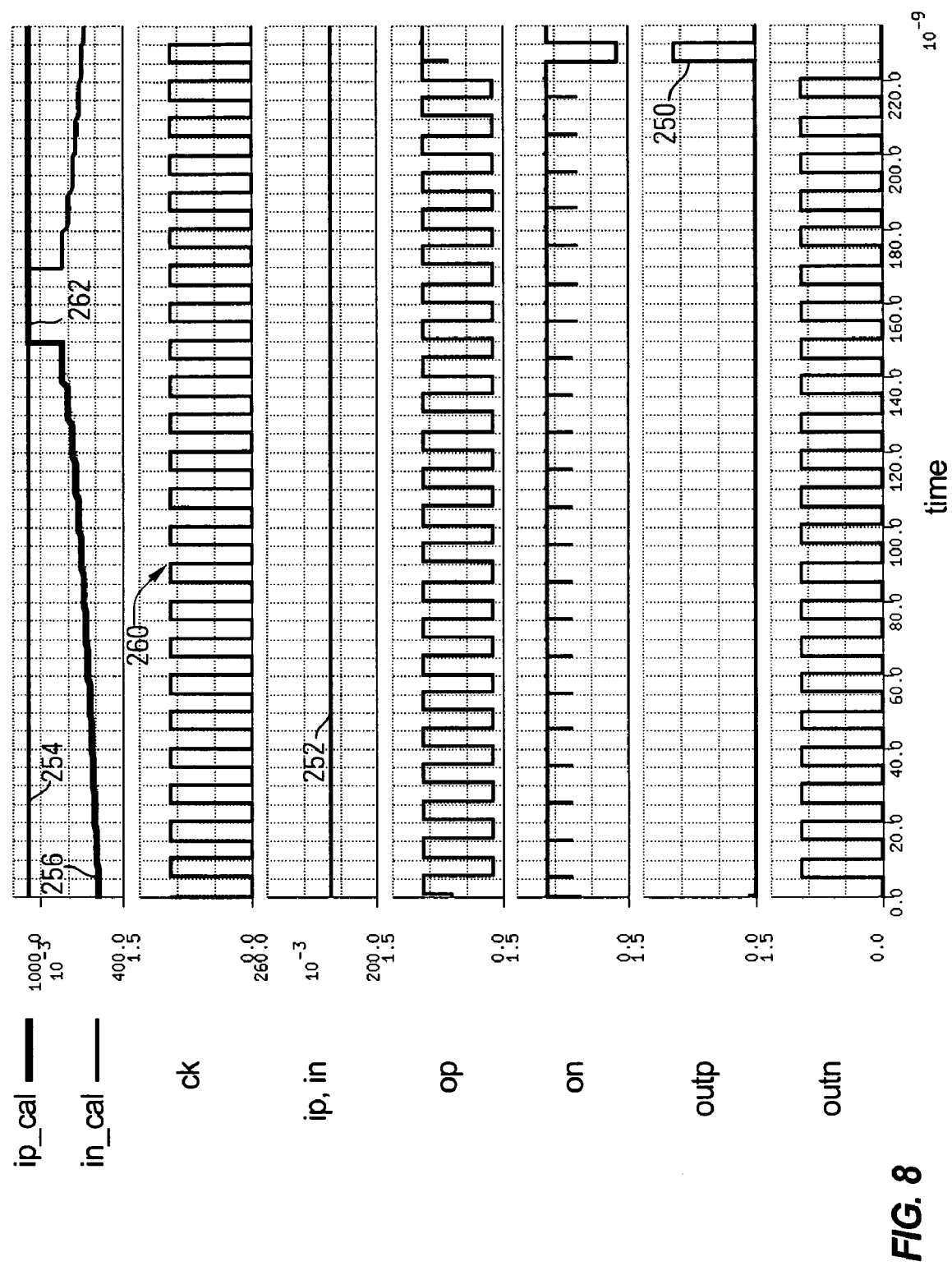
FIG. 8 is a timing diagram illustrating an exemplary calibration process for the comparator circuit of FIG. 1 with the circuit unbalanced in another exemplary way.

Referring now to FIG. 8, a calibration process for another exemplary comparator circuit with a 50 mV bias due to a stronger PFET 72 will be described. As with FIG. 7, the timing diagram of FIG. 8 only covers the exemplary calibration process, which ends as soon as outp 16 changes state 250. Again, ip 12 and in 14 are set to the same voltage level 252 of 250 mV. The in_cal 70 signal is set to a current of 0 uA, from which current mirror 84 generates a voltage 254 of 1.08 volts. The ip_cal 66 signal is set to an initial current of 80 uA, from which current mirror 82 generates a voltage 256 of about 580 mV. The clock signal CK 52 oscillates 260, establishing the precharging phases and evaluation phases for the comparator circuit. The input current at ip_cal 66 is decremented in 5 uA steps as described above, one step per clock cycle, until in this case it reaches 0 uA, from which current mirror 82 generates a voltage 262 of 1.08 volts. Because outp 16 did not change state before ip_cal 66 reached 0 uA, the in_cal 70 signal is incremented in 5 uA steps until outp 16 changes state 250 and the calibration process is terminated. The current levels of ip_cal 66 and in_cal 70 just before outp 16 changed state 250, 30 uA and 0 uA, respectively, are used as the static current offset cancellation signals applied to ip_cal 66 and in_cal 70 during normal operation of the comparator circuit 10. In this case, outp 16 changes state after about 6 current steps from the middle 0 uA state. This illustrates the digitized resolution of the current steps that results in an offset cancellation state that can be off by plus or minus one current step. The comparator circuit was set up with an offset of negative 50 mV for the calibration process illustrated in FIG. 8, and the exemplary calibration process selected offset cancellation signals at the level of the sixth step. Again, for more precise offset cancellation levels, a finer current step granularity may be selected.

Figure 9:
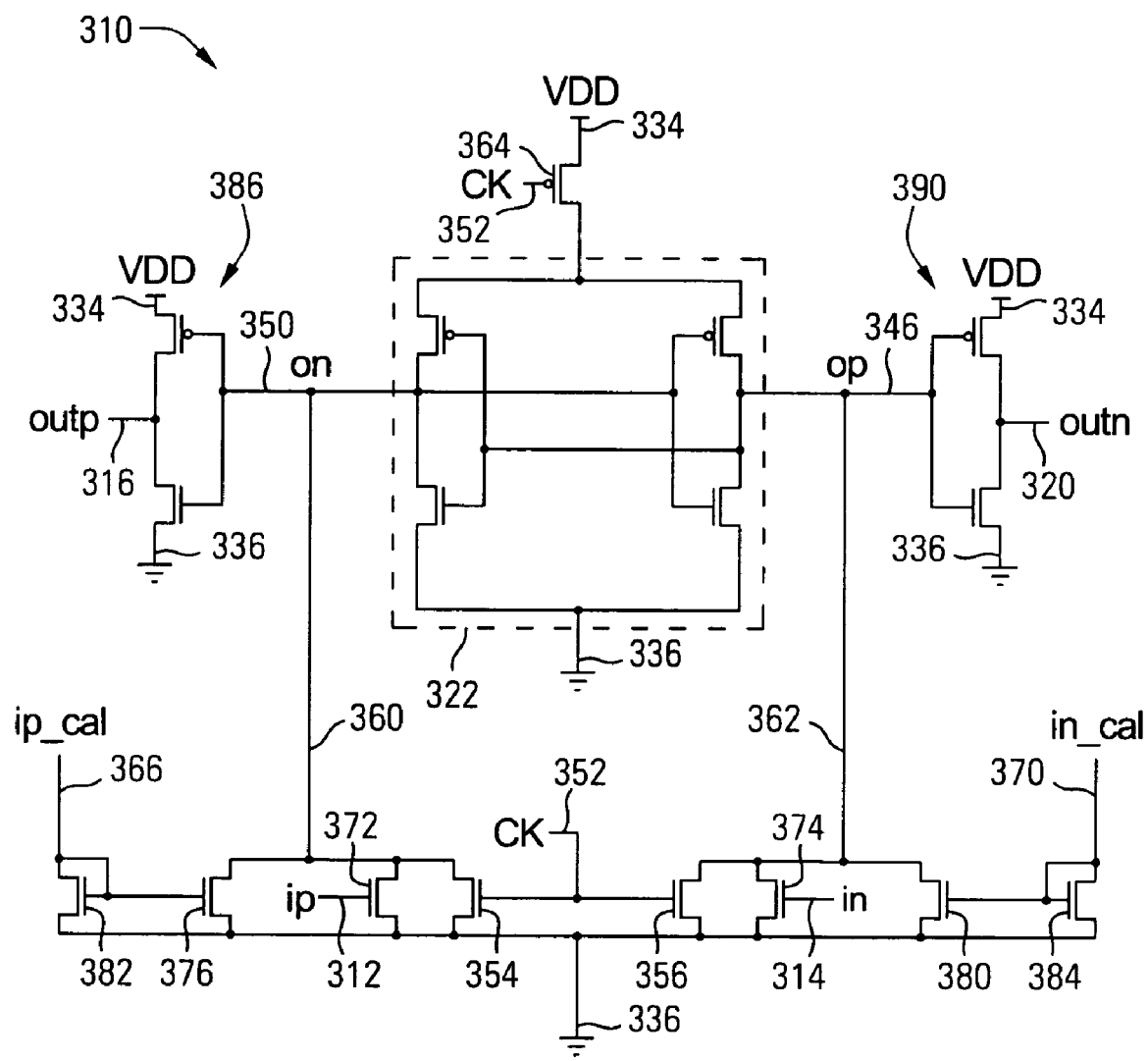
FIG. 9 is a schematic diagram of another exemplary comparator circuit with offset cancellation.

As discussed above, the input transistors 72, 74, 76, 80, 82 and 84 operate in analog mode. The exemplary comparator circuit 10 is designed such that ip 12 and in 14 inputs have low common mode voltage, where the cross-over of ip 12 and in 14 is less than 0.5 volts. Alternatively, the comparator circuit may be designed for high common mode voltage, where the cross-over of ip 12 and in 14 would be greater than 0.5 volts, by mirroring the circuit elements as illustrated in FIG. 9. In this exemplary embodiment, a comparator circuit 310 includes a pair 322 of cross-coupled inverters to perform the comparison as before, and a pair of inverters 386 and 390 to buffer the outputs outp 316 and outn 320 as before. The intermediate outputs op 346 and on 350 are "precharged" to the voltage level of a ground 336 during high phases of a clock signal CK 352. Precharging NFETS 354 and 356 are connected between ground 336 and intermediate output nodes on 350 and op 346, respectively. The gates of the precharging NFETS 354 and 356 are connected to the clock signal CK 352. Thus, when the clock signal CK 352 is high, the intermediate output nodes op 346 and on 350 are connected to ground 336 and are "precharged" to a low level. The pair of cross-coupled inverters 322 are connected to power VDD 334 through a clocked PFET 364 to differentiate the evaluation phase of the comparator circuit 310 from the precharging phase. Thus, when the clock signal CK 352 is low, the pair of cross-coupled inverters 322 are connected to power VDD 334 and comparison is enabled.

The nodes 360 and 362 associated with the ip 312 and in 314 input signals are driven by a combination of the signals to be compared, ip 312 and in 314, and offset cancellation inputs ip_cal 366 and in_cal 370 as before. The input signals to be compared, ip 312 and in 314, control NFETS 372 and 374, respectively. The input NFETS 372 and 374 are connected between ground 336 and nodes 360 and 362 to the pair of cross-coupled inverters 322. The input signals to be compared, ip 312 and in 314, are connected to the gates of the input NFETS 372 and 374 so that the voltages of nodes 360 and 362 are proportional to the voltages of the input signals ip 312 and in 314. In a properly balanced or bias-compensated comparator circuit 310, when ip 312 is greater than in 314, outp 316 will be asserted (high) and outn 320 will be unasserted (low). The offset cancellation signals ip_cal 366 and in_cal 370 also contribute to nodes 360 and 362. Offset cancellation NFETS 376 and 380 are connected between ground 336 and nodes 360 and 362, with ip_cal 366 and in_cal 370 connected to their gates. The exemplary comparator circuit 310 uses static current inputs at ip_cal 366 and in_cal 370, so current mirror NFETS 382 and 384 are used to generate a bias voltage from the static input currents at ip_cal 366 and in_cal 370. The drain of each of the current mirror NFETS 382 and 384 is connected to ground 336. The source and gate of current mirror NFET 382 are connected to ip_cal 366, and the source and gate of current mirror NFET 384 are connected to in_cal 370. Because the sources and gates of the current mirror NFETS 382 and 384 are connected, they operate as diodes, generating a bias voltage based on the offset cancellation current inputs ip_cal 366 and in_cal 370. Note that the input transistors 372, 374, 376, 380, 382 and 384 operate in analog mode, wherein the input voltage is converted to a proportional output current. The greater the gate bias voltage, the greater the output current will be.

Thus, ip 312 and ip_cal 366 are combined at node 360, and in 314 and in_cal 370 are combined at node 362. By providing static input currents of predetermined levels at ip_cal 366 and in_cal 370, any bias or offset in the comparator circuit 310 such as that due to process variation during fabrication can be compensated for and eliminated. The calibration process to identify the predetermined levels for ip_cal 366 and in_cal 370 operates as described above with respect to exemplary comparator circuit 10.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A method of comparing signals, comprising:
   obtaining first and second signals to be compared;
   obtaining first and second offset cancellation signals;
   combining said first offset cancellation signal with said first signal to be compared to form a first combined signal and combining said second offset cancellation signal with said second signal to be compared to form a second combined signal;
   calibrating said first and second offset cancellation signals, said calibrating comprising setting said first and second signals to be compared to an equal level and finding a setting for said first and second offset cancellation signals at which an output changes state;
   comparing said combined first signal with said combined second signal; and
   producing said output indicating which of said combined first signal or said combined second signal is greater.

2. The method of claim 1, further comprising buffering said output to provide a full signal swing.

3. The method of claim 2, wherein said buffering comprises inverting.

4. The method of claim 1, further comprising precharging said output substantially to a voltage level of a power signal powering a circuit performing said comparing.

5. The method of claim 1, said finding comprising:
setting said first offset cancellation signal to a zero level and said second offset cancellation signal to a non-zero level;
decrementing said second offset cancellation signal through a plurality of levels until it reaches said zero level;
incrementing said first offset cancellation signal through a plurality of levels until it reaches said non-zero level; and
identifying said setting for said first and second offset cancellation signals at which said output changes state.

6. The method of claim 5, said finding further comprising terminating said decrementing and incrementing when said output changes state, wherein said identified setting is a setting used for said first and second offset cancellation signals just before said output changed state.

7. A comparator circuit with offset cancellation, comprising:
at least four switches each having an input, an output and a control input, said output being connected to said input when said control input is asserted, said inputs being connected to a constant voltage level signal, a first and second of said control inputs being connected to signal inputs to be compared, a third and fourth of said control inputs being connected to offset cancellation inputs;
a comparator having two inputs and at least one output, a first of said two comparator inputs being connected to said first and third switch outputs, a second of said two comparator inputs being connected to said second and fourth switch outputs; and
a fifth switch having an input connected to said constant voltage level signal and an output and a control input both connected to one of said offset cancellation inputs, and a sixth switch having an input connected to said constant voltage level signal and an output and a control input both connected to another of said offset cancellation inputs.

8. The comparator circuit of claim 7, said constant voltage level signal comprising a ground.

9. The comparator circuit of claim 7, said constant voltage level signal comprising a power source.

10. The comparator circuit of claim 7, wherein said fifth and sixth switches having said outputs and said control inputs connected to said offset cancellation inputs operate as diodes.

11. The comparator circuit of claim 10, wherein said fifth and sixth switches operating as diodes comprise PFETS.

12. The comparator circuit of claim 7, wherein said fifth and sixth switches comprise transistors.

13. The comparator circuit of claim 7, wherein offset cancellation inputs comprise static current inputs.

14. The comparator circuit of claim 9, wherein said comparator comprises a pair of cross-coupled inverters.

15. The comparator circuit of claim 14, said comparator having a power connection and a ground connection, said power connection being connected to said power source, said comparator circuit further comprising a ground clocking switch having an input connected to said comparator ground connection, an output connected to ground, and a control input connected to a clock signal.

16. The comparator circuit of claim 7, wherein said at least four switches comprise PFETS and said control inputs are asserted when at a low voltage state.

17. The comparator circuit of claim 9, further comprising a precharging switch having an input connected to said power source, an output, and a control input connected to a clock signal, said precharging switch output being connected to said at least one comparator output.

18. The comparator circuit of claim 7, further comprising an inverter connected to said at least one comparator output to provide a full signal swing at an output of said inverter.

* * * * *